United States Patent [19]

Park

[11] Patent Number: 5,470,196

[45] Date of Patent: Nov. 28, 1995

[54] CARRIER HANDLING SYSTEM

[75] Inventor: Joon Park, Glendale, Calif.

[73] Assignee: Hughes Aircraft Company, Los Angeles, Calif.

[21] Appl. No.: 323,297

[22] Filed: Oct. 14, 1994

[51] Int. Cl.$^6$ .................................................. B65G 59/06
[52] U.S. Cl. ...................... 414/797.9; 414/224; 414/750; 414/751
[58] Field of Search .................................. 414/224, 750, 414/751, 752, 797.9

[56] References Cited

U.S. PATENT DOCUMENTS 4,588,342  5/1986  Hirokawa et al. .................. 414/750 X
4,907,931  3/1990  Mallory et al. ...................... 414/752 X Primary Examiner—Michael S. Huppert
Assistant Examiner—Janice L. Krizek
Attorney, Agent, or Firm—Leonard A. Alkov; W. K. Denson-Low

[57] ABSTRACT

The carrier handling system has a plurality of magazine tubes which contain carriers. In each tube, the carrier contains a different electronic component. A carriage is mounted on the base and moves on rectangular coordinates to the selected magazine tube. The collector saddle on the carriage is raised and the lowest carrier in the selected magazine is pushed out into the collector saddle. The collector saddle is moved to a reference position where the carrier is positioned for further processing.

1 Claim, 4 Drawing Sheets

CARRIER HANDLING SYSTEM

FIELD OF THE INVENTION

This invention is directed to a system by which an electronic component retaining carrier is selected and moved to a predetermined position.

BACKGROUND OF THE INVENTION

Many small electronic components are placed on printed wiring boards to create an electronic circuit. These electronic components include small discrete devices and/or multiple devices on a chip. Many different such devices are applied to the same card and must be made easily available. In addition, an assembly machine may handle the assembly of many different types of printed wiring boards thereby requiring additional kinds of electronic devices. Thus, more different kinds of electronic devices must be available than may be required on any particular one printed wiring board.

Carriers are available to releasably retain different types of electronic devices. The carriers may be made different internally where they releasably retain an electronic device, but are externally the same so that they can be handled conveniently in a standardized storage tube and handling system. A plurality of storage tubes is available so that a different electronic component can be supplied in each storage tube. The problem then becomes one of automatically going to a particular storage tube, removing a carrier and its component from the selected storage tube, and thereupon moving the carrier and its component to a position where it can be acted upon further. The next step may be to remove the component from the carrier, test it, and place it on the printed wiring board. The carrier handling system must be reliable, controllable, and of long life so that it accurately delivers carriers to the output position.

SUMMARY OF THE INVENTION

In order to aid in the understanding of this invention, it can be stated in essentially summary form that it is directed to a carrier handling system wherein a saddle moves to a selected carrier storage tube, and a pusher on the saddle removes the carrier from the storage tube and places it on the saddle. Thereupon, the saddle moves on at least two axes to move the carrier to the next position where it will be acted upon.

It is, thus, a purpose and advantage of this invention to provide a carrier handling system which selects an electronic component containing carrier from one of a plurality of carrier storage tubes and moves it to a selected position with reliability, repeatability and accuracy.

Other purposes and advantages of this invention will become apparent from a study of the following portion of the specification, the claims and the attached drawings wherein:

DESCRIPTION OF THE PREFERRED EMBODIMENT

Figure 2:
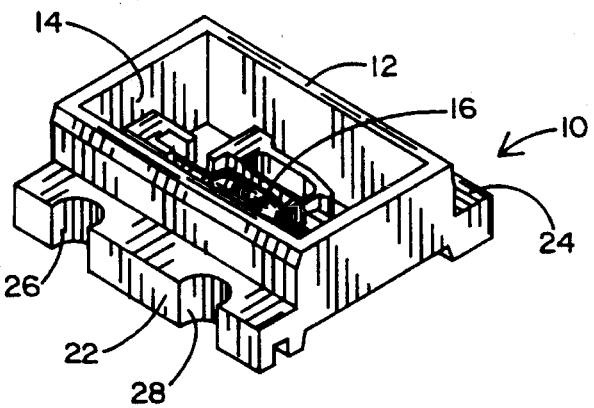
FIG. 2 is an isometric view of an electronic component handling carrier.

An electronic component carrier is generally indicated at 10 in FIG. 2. The carrier 10 has a body 12 which has an interior recess 14 into which a component 16 is inserted and retained. Different configurations of the retention mechanism may be formed in accordance with the configuration of the component. As seen in top view in FIG. 3, the component 16 in carrier 10 is a component with axial leads; for example, a resistor. It is held in place by resilient fingers which accurately locate the components until the fingers are forcibly released. The carrier 10 has flanges 22 and 24 extending laterally from the main body. The flanges have guide notches 26, 28 and 30 for angular positioning of the carrier. Guide notches 26 and 28 are seen in FIGS. 2 and 3, while guide notch 30 is seen only in FIG. 3.

Figure 1:
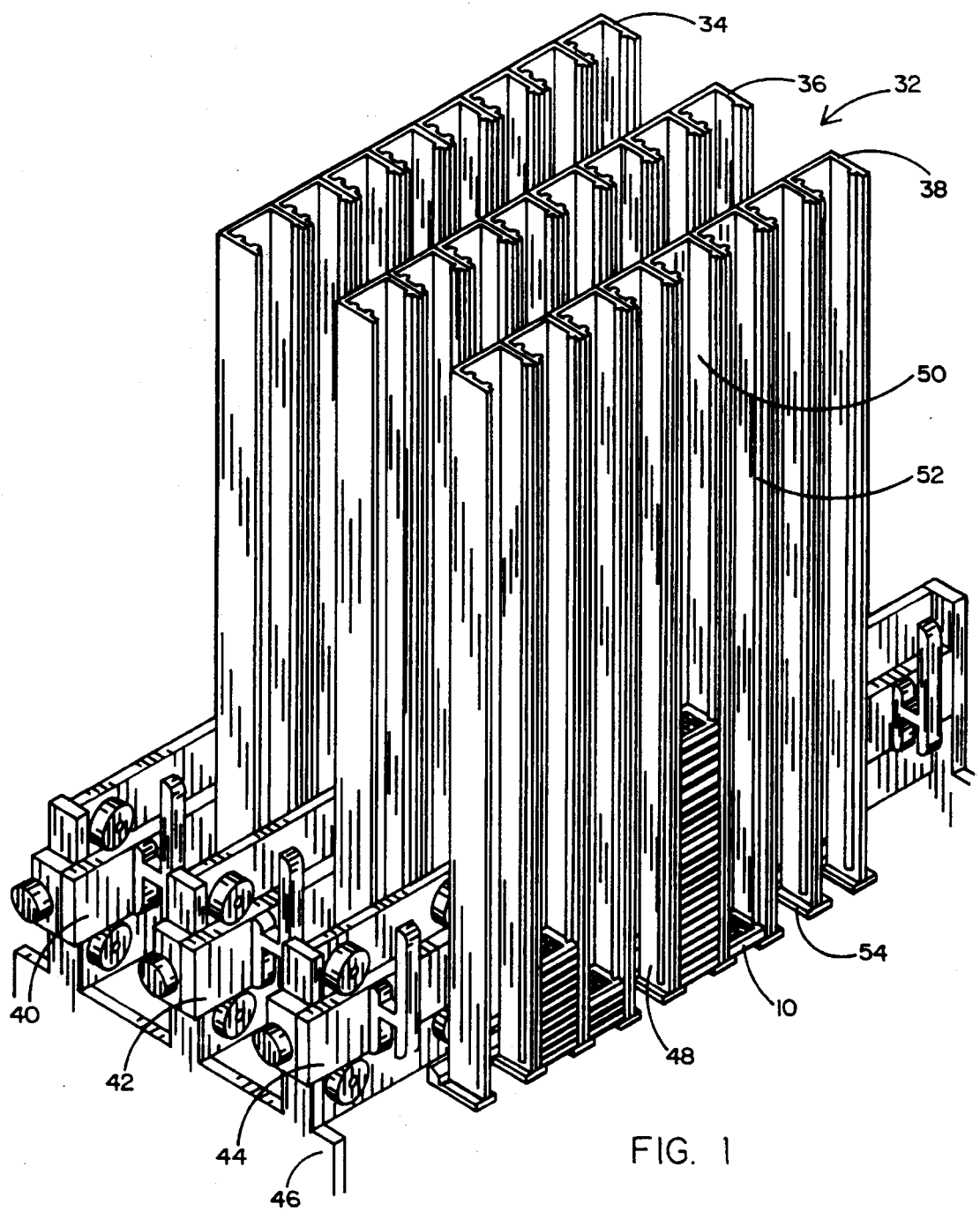
FIG. 1 is an isometric view of a set of carrier storage tubes from which carriers are successively selected.

Magazine 32, shown in FIG. 1, is the device which retains a plurality of carrier storage tubes which contain carriers containing different electronic components. The required carrier is to be selected from one of the sets of carrier storage tubes or magazine tubes in the magazine 32. Three sets of magazine tubes are shown therein as an example. Sets 34, 36 and 38 of magazine tubes are shown, although more or fewer than three sets can be employed with the carrier handling system of this invention. The sets of magazine tubes each comprise eight identical tubes, although more or fewer than eight tubes can be arranged in a set. Each set is on its own slide bar, with slide bars 40, 42 and 44 shown. The tubes are secured to the slide bar, and the slide bars are roller-mounted to the magazine frame 46. When the slide bars are in the IN position shown in FIG. 1, they are locked so that the sets of magazine tubes are in a positively located position. The slide bars allow removability and accessibility to the sets of magazine tubes for access to the individual magazine tubes and/or replacement of an entire set of magazine tubes.

Figure 3:
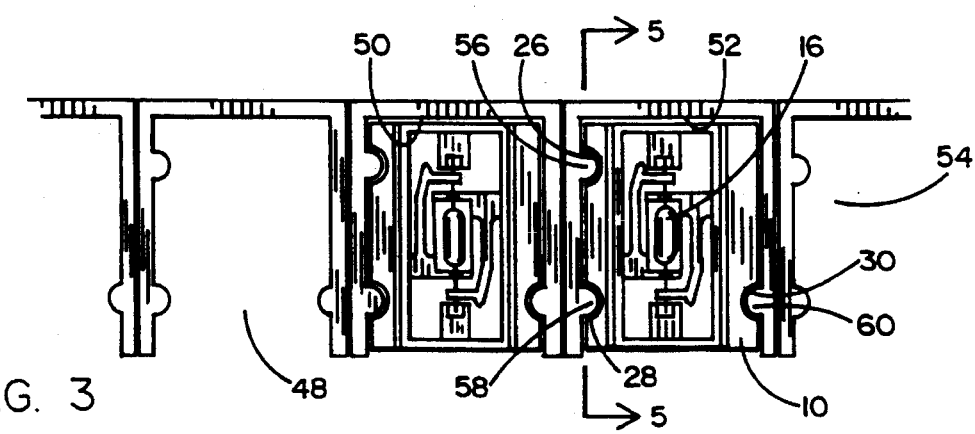
FIG. 3 is an enlarged top view of several of the storage tubes, with parts broken away.
Figure 4:
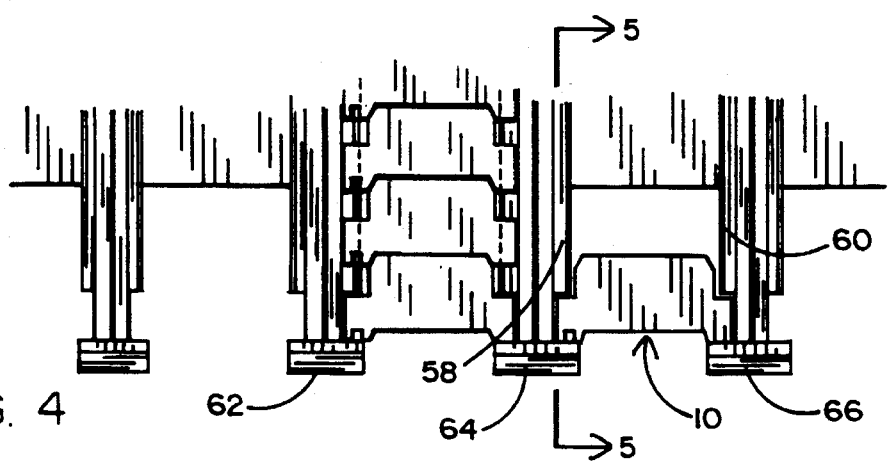
FIG. 4 is an enlarged front view of several of the storage tubes, with parts broken away.
Figure 5:
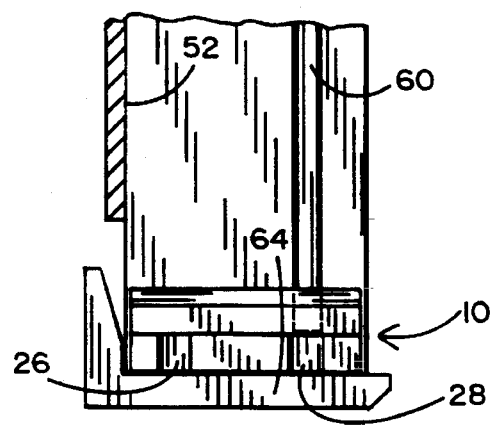
FIG. 5 is a section taken generally along the line 5—5 of FIGS. 3 and 4, with parts broken away.

The magazine tubes 48, 50, 52 and 54 are of particular interest because they are seen enlarged in FIGS. 3 and 4, and magazine tube 52 is seen in elevation with its near side removed in FIG. 5. These are representative of any of the magazine tubes in the system.

Tube 54 has only the one carrier 10 in it to aid in reviewing of the structure. As is seen in FIG. 3, the magazine tube 52 has guide rails 56 and 58 down its left side and guide rail 60 down its right side. These rails are respectively received in notches 26, 28 and 30 of the carrier 10 in order to permit the carrier to be inserted in only one orientation into the tube. The magazine tubes may be extruded U-shaped devices with the individual tubes secured together on a backing plate and/or to the corresponding slide bar.

Feet 62, 64 and 66 are at the bottom of the tubes and extend out from the sides of the magazine tubes only about as far as the rails, leaving the center open. However, the rails terminate above the feet a predetermined distance, which is larger than the thickness of the carrier flanges 22 and 24, as seen in FIG. 4. The rails, thus, guide all of the carriers down, except the bottom carrier is free of the rails when it is touching the foot. In this position, the bottom carrier can be moved out of the tube onto the positioner saddle.

Figure 6:
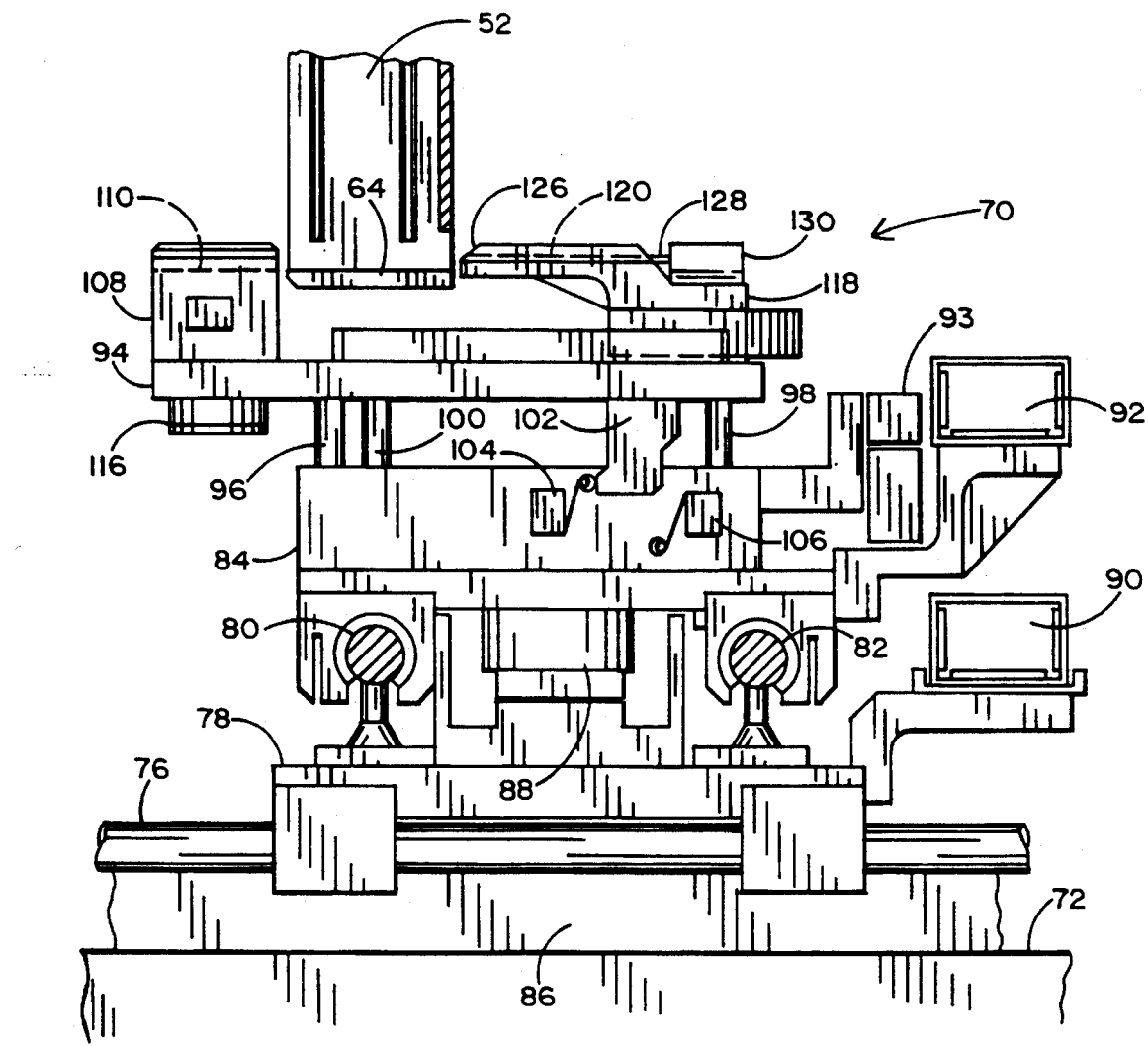
FIG. 6 is a side-elevational view, with parts broken away, of the carrier handling system of this invention.
Figure 7:
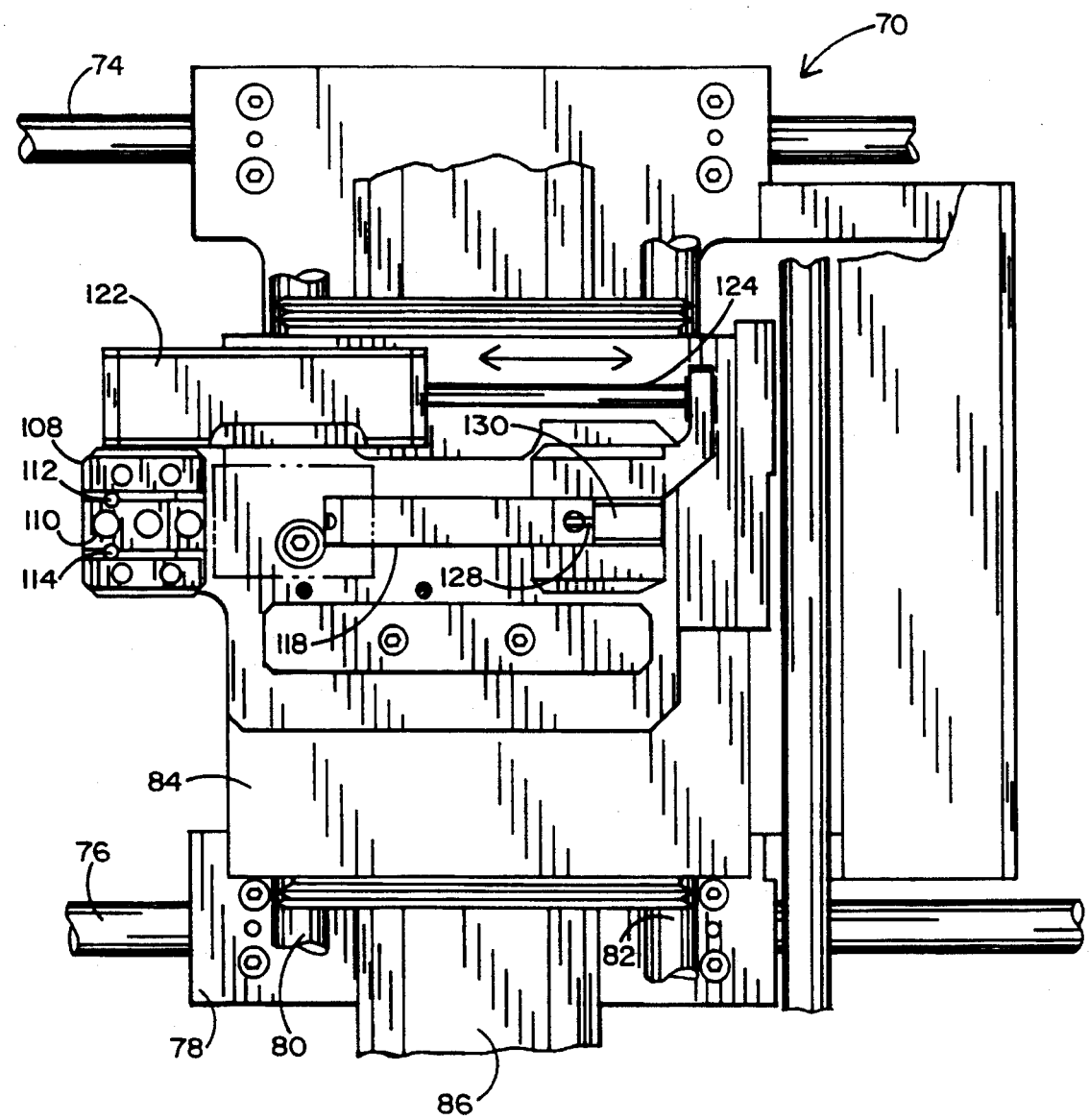
FIG. 7 is a plan view thereof, with parts broken away.

Positioner 70 is shown in elevation as the right side view in FIG. 6 and is shown in top plan view in FIG. 7. Positioner 70 is mounted on a base 72. Rails 74 and 76 are mounted on the base and carry the carriage 78. Cross rails 80 and 82 are mounted on the carriage 78 and carry table 84. The table 84 is an X-Y positioning table and is powered to move into a programmed and preselected position, as is determined by a control system such as a control computer. Forward and backward positioning is controlled by the linear motor 86, while cross positioning is powered and controlled by the linear motor 88. Other positioning systems can be used, but the linear motor accomplishes both the motion of the relative parts, but also provides positive feedback of linear position. Position encoder assembly signals position into the control system. Control cables to the various parts are positioned in raceways 90 and 92.

Collector plate 94 is mounted to the up-and-down actuator on the table 84. Guide rods 96 and 98 are fixed on the collector plate 94 and engage down into guide bores in the table 84. Thus, the collector plate 94 is constrained to move up and down with respect to the table 84. Piston rod 100 is secured to the collector plate 94 and enters into a cylinder on table 84. Energization of the cylinder raises and lowers the collector plate 94. Cam 102 is mounted on the collector plate and extends downwardly therefrom. Switches 104 and 106 are engaged by the cam 102 and signal when the collector plate 94 is raised and signal when the collector plate 94 is in its lowered position.

Collector 108 has a channel 110 therein which is in line with the selected magazine tube 52, and the bottom of the channel is in line with or slightly below the top of foot 64. The channel is sized so that the bottom carrier 10 in the selected magazine tube 52 can be thrust out of the magazine tube 52 into the channel 110 in the collector 108. Stop pins 112 and 114 stop the carrier so that it does not get pushed through the collector. The stop pins 112 and 114 are in the raised position and are held there by means of the cylinder 116. The stop pins 112 and 114 can be lowered when desired.

Pusher 118 is positioned on the opposite side of the selected tube 52. Its finger 120 is sized to enter the back of the magazine tube 52 behind the lowermost carrier 10 therein and push the lowermost carrier 10 into the channel 110 where it is stopped by pins 112 and 114. The pusher 118 is guided in dovetails for sliding on the top of collector plate 94 and is actuated by cylinder 122. Cylinder 122 is mounted on the collector plate 94 and has its piston rod 124 connected to pusher 118. In this way, the bottom-most carrier 10 is transferred to the collector 108, and it is retained therein for subsequent positioning.

The operation of the carrier handling system is as follows. With the collector plate 94 in its lowered position, the collector saddle 108 and pusher finger 120 are below the level of the magazine tubes. With the collector plate 94 in the lowered position, the table 84 is automatically positioned on its two axes until the table has the finger 120 and collector saddle 108 below the selected magazine tube. It is important to note that, in the lowered position, the collector saddle 108 and the pusher finger 120 are below all of the magazine tubes so that the table 84 may be moved under the magazine tubes unobstructed to the selected position.

Once in position, the collector plate 94 is raised to the position shown in FIG. 6. Saddle collector 108 and finger 120 are sized so that they can extend up between the rows of magazine tubes. Thus, any number of rows of magazine tubes can be employed. Once in the raised position, finger 120 is actuated by cylinder 122 to thrust the lowermost carrier in the selected magazine tube out of the magazine tube into channel 110 in the collector saddle 108. The front of the pusher finger 120 is chamfered at 126 to prevent the finger 120 from engaging on the end of the next higher carrier in the magazine tube. However, as long as the carriers are of standard thickness, this does not cause a problem. After the selected carrier is pushed into the collector's channel 110 against stop pins 112 and 114, the finger 120 is retracted to the position shown in FIG. 6. Thereupon, collector plate 94 is lowered so that collector saddle 108 and pusher finger 120 are below the bottoms of the magazine tubes.

Next, the table 84 is moved on its two axes to the reference position where the carrier is to be transferred. Assuming that the next processing location is an unloading station, the collector saddle 108 lines up with the unloading station, the stop pins 112 and 114 are lowered, and the pusher 118 is advanced. The finger 120 is not configured to enter into the channel 110 because it is T-shaped to extend down below the feet which form the bottoms of the magazine tubes. Instead, there is a small ejector rod 128 which extends through pusher finger 118. The ejector rod is controlled by ejector cylinder 130, which extends the ejector rod 128 to push the carrier out of the collector saddle 108 into the receiving location. The carrier handling system is now ready to return to pick up the next carrier with its electronic component.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A carrier handling system comprising:

a substantially horizontal base;

a plurality of magazine tubes above said base for releasably retaining carriers which contain various electronic components;

a carriage movably mounted on said base for movement in a first direction, a linear motor connected between said base and said carriage for moving said carriage in said first direction;

a table mounted on said carriage for movement in a second direction, a linear motor connected between said carriage and said table for moving said table with respect to said carriage in said second direction;

a collector plate mounted on said table, a pusher finger movably mounted on said collector plate, wherein said finger has a chamfered upper surface so as to disengage more than one carrier from said pusher finger, for removing a carrier from a magazine tube and releasably retaining the removed carrier with respect to said collector plate so that said linear motors move said collector plate adjacent a selected magazine tube for removing a carrier therefrom and releasably retaining a carrier thereon, a saddle, said saddle having a movable stop pin for stopping a carrier in said saddle as the carrier is moved out of said selected magazine tube into said saddle, wherein said collector plate is mounted on said table for motion in a third direction, said collector plate having a lowered position and a raised position along said third direction, means for removing and receiving a carrier being below said magazine tube when said collector plate is in its lowered position and being substantially in line with the carrier in the bottom of said selected magazine tube when said collector plate is in its raised position, and wherein said saddle is movable to an ejection position wherein a carrier is ejected from said saddle after removal of an electronic component from the carrier, said pusher finger having an ejector rod thereon and means to move said ejector rod so that when said stop pin on said saddle is retracted and said ejector rod is actuated, the carrier is discharged from said saddle.

* * * * *